United States Patent [19]
Gowlett et al.

[11] Patent Number: 5,177,364
[45] Date of Patent: Jan. 5, 1993

[54] INFRARED DETECTOR CONSTRUCTION INCLUDING A GETTER AND METHOD FOR MANUFACTURING SAME

[75] Inventors: David J. Gowlett; Robert J. Barton, both of Southampton, United Kingdom

[73] Assignee: U.S. Philips Corp., New York, N.Y.

[21] Appl. No.: 718,456

[22] Filed: Jun. 20, 1991

[30] Foreign Application Priority Data

Jun. 22, 1990 [GB] United Kingdom ............... 9013939

[51] Int. Cl.$^5$ ............................................. G12B 15/00
[52] U.S. Cl. ................................. 250/352; 250/370.15
[58] Field of Search ........................... 250/352, 370.15

[56] References Cited

U.S. PATENT DOCUMENTS

| | | | |
|---|---|---|---|
| 3,851,173 | 11/1974 | Taylor et al. | 250/332 |
| 4,206,354 | 6/1980 | Small, Jr. | 250/349 |
| 4,474,036 | 10/1984 | Ball et al. | 62/51.1 |
| 4,528,449 | 7/1985 | Gordon et al. | 250/352 |
| 4,886,240 | 12/1989 | Rich | 250/352 |
| 5,012,102 | 4/1991 | Gowlett | 250/352 |

Primary Examiner—Constantine Hannaher
Attorney, Agent, or Firm—William L. Botjer

[57] ABSTRACT

An infrared detector comprises an envelope in which a detector element (3) is mounted on an end of a cold finger (1). A chemically-active getter (30) is present in the space between the cold finger (1) and the envelope window (7) and outer wall (2). In accordance with the present invention the getter comprises a porous layer (30) of chemically-active getter material deposited on an inside surface area of the outer wall (2) at a location separated from both the cold finger (1) and the window (7). The getter (30) can be activated (or re-activated) by heating through the portion of the outer wall (2) on which the getter material (30) is deposited, e.g. using a heater coil (50). Preferably the getter material (30) on the outer wall (2) extends around heat reflector, e.g. a reflective surface area of the cold finger (1). The cold finger (1) may be operated to cool the detector element (3) while heating the layer (30) to activate the getter.

10 Claims, 1 Drawing Sheet

INFRARED DETECTOR CONSTRUCTION INCLUDING A GETTER AND METHOD FOR MANUFACTURING SAME

BACKGROUND OF THE INVENTION

This invention relates to infrared detectors comprising an envelope with a space in which a chemically-active getter is present, and further relates to methods of manufacturing infrared detectors.

U.S. Pat. No. 3,851,173 describes one example of an infrared detector comprising an envelope, a cold finger in the envelope and at least one detector element mounted on an end of the cold finger so as to be cooled by the cold finger in operation of the detector. The envelope has an outer wall extending around the cold finger and an infrared-transmissive window facing the detector-element end of the cold finger. A space is present between the cold finger and the window and outer wall of the envelope, and a chemically-active getter is present in said space to getter gases from the space.

In the form disclosed in U.S. Pat. No. 3,851,173 the envelope is a vacuum dewar having a vacuum space between inner and outer walls of the dewar envelope. The inner wall defines an inner chamber accommodating a cryogenic cooling element which serves to cool the inner wall end and hence the detector element thereon, during operation of the detector. The cooled inner wall forms the cold finger of the detector. A major cause of infrared detector failure is the gradual degeneration of the vacuum in the space between the inner and outer walls due to internal out-gassing of the various component parts of the detector exposed to the vacuum. In the detector of U.S. Pat. No. 3,851,173 a non-evaporable chemically-active SAES getter unit is mounted in the outer wall to maintain a good vacuum in the space between the outer wall and the cold finger. Such chemical getters are activated by being taken to a high temperature during or after evacuating and sealing the dewar envelope. This is normally achieved with an electrical heating element embedded in the getter material formed as a unit with electrical connection leads (not specifically shown in U.S. Pat. No. 3,851,173) passing through vacuum-tight seals in the dewar. U.S. Pat. No. 4,206,354 shows an example of such a dewar getter with its connection leads.

SUMMARY OF THE INVENTION

It is an aim of the present invention to provide a different getter configuration which can be less expensive than using a getter unit, can have a large active surface area in the space around the cold finger and can be accommodated in the small space of a compact detector envelope without requiring an increased envelope size or an unconventional envelope outline for its accommodation.

According to one aspect of the present invention there is provided an infrared detector comprising an envelope, a cold finger in the envelope and at least one detector element mounted on an end of the cold finger so as to be cooled by the cold finger in operation of the detector, the envelope having an outer wall extending around the cold finger and an infrared-transmissive window facing the detector-element end of the cold finger, a space being present between the cold finger and the window and outer wall of the envelope, and a chemically-active getter present in said space to getter gases from the space, the detector being characterised in that the getter comprises a porous layer of chemically-active getter material deposited on an inside surface area of the outer wall at a location separated from both the cold finger and the window.

It may be noted that published United Kingdom patent application GB-A-2 179 785 describes a pumping tubulation getter device for an electron discharge device such as a ring laser gyroscope. GB-A-2 179 785 describes the provision of the getter as an electrophoretically-deposited layer of porous sintered non-evaporable getter material selectively deposited on the internal surface of the pump tube through which the device is evacuated. Getter-free zones are present at each end on the internal surface of the tube. The getter is activated by HF induction heating of the tube. By locating the getter within the pump tube, space problems which otherwise arise in trying to accommodate a getter unit within the device chamber are avoided. The whole contents of GB-A-2 179 785 are hereby incorporated herein as reference material. However, GB-A-2 179 785 contains no mention of infrared detectors.

The present invention provides advantages for infrared detectors as compared with depositing the getter layer in a pump tube. Thus, for example, a larger area is available on an inside surface of the outer wall of the envelope than on the inside of a pump tube of an infrared detector. This permits the inclusion of a larger surface area of getter material (and possibly also a greater thickness of the porous getter material) so that the getter in accordance with the present invention can have a large capacity and fast gettering speed. Furthermore, there is less restriction on the thickness and material of the outer wall than of a pump tube since a pump tube needs to be pinched off in sealing the device space. The location at which such a pump tube is pinched off also places more of a restriction on the location and length of a getter layer therein than occurs with a getter layer on the inside of the outer wall of an infrared detector.

However, care is needed in the separation of the getter layer (or at least a part of the layer to be activated) from the detector window and cold finger to prevent damage to the window and cold finger during activation of the getter. This affects both the material of the envelope wall and the distance of the activated getter area from the window and the cold finger. The whole outer wall of the envelope may be of a thermally-insulating material, for example a glass or ceramic; or for example when the outer wall comprises a metal portion on which the getter material is deposited a thermal resistance path to the window can be provided by a thermally-insulating portion which separates the metal portion from the window.

A shield similar to the cylindrical shield 178 illustrated in U.S. Pat. No. 3,851,173 may surround a substantial portion of the cold finger and the detector elements thereon to protect both during activation heating of the getter. In order to concentrate the heat radiation during activation heating, preferably in accordance with the present invention, the chemically-active getter material on the outer wall extends around a heat reflector from which it is separated in the envelope by the space. This reflector may be a reflective surface of a cylindrical heat shield member in the space. However, the heat reflector may comprise an existing component of the detector, e.g. a reflective surface area of the cold finger and/or a reflective surface of a radiation shield mounted on the cold finger around the detector element(s). This provides protection for the detector element(s) as well as increasing the efficiency of the activation heating.

According to another aspect of the present invention there is provided a method of manufacturing an infrared detector in accordance with the present invention, characterised by the steps of:

(a) depositing the porous layer of chemically-active getter material on the inside surface area of the outer wall of the envelope, (b) mounting at least one detector element on the end of the cold finger, (c) mounting the window on the outer wall of the envelope to enclose the space within the envelope, and (d) activating the getter by heating the layer of getter material through the outer wall of the envelope.

BRIEF DESCRIPTION OF THE DRAWING

These and other features in accordance with the invention are illustrated, by way of example, in specific embodiments of the invention now to be described with reference to the accompanying diagrammatic drawing, in which.

Figure 1:
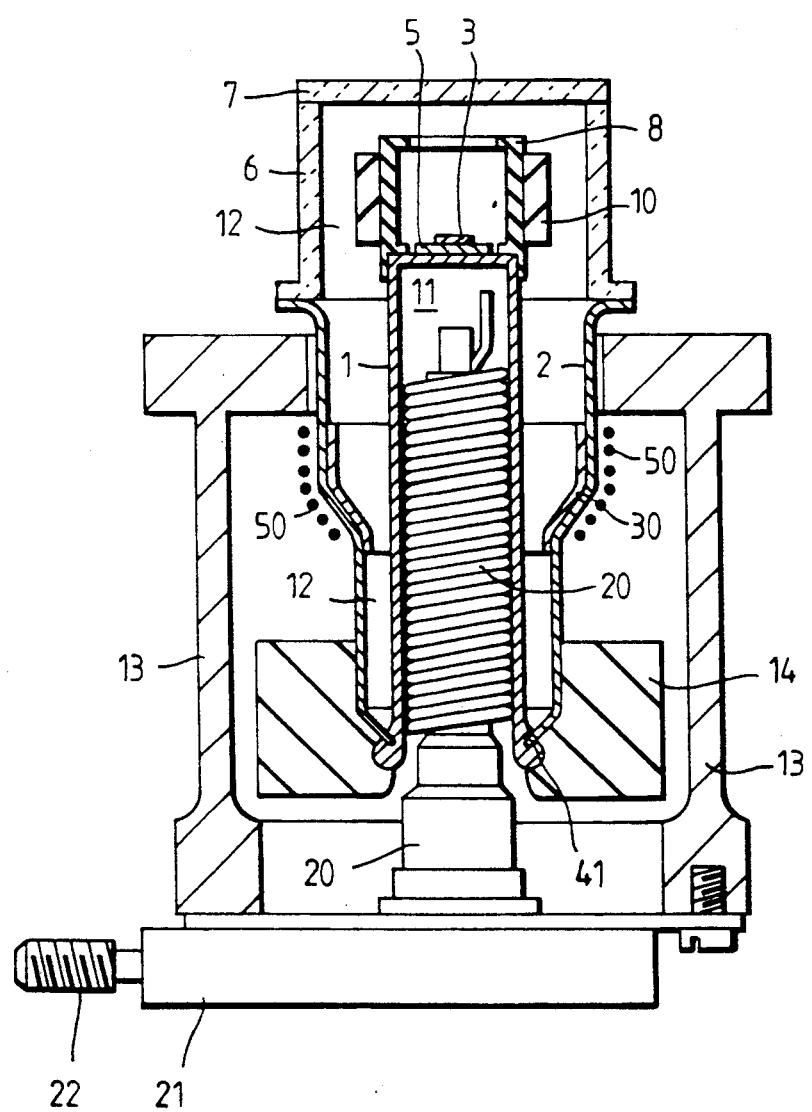
FIG. 1 is a partly cross-sectional view and partly side view of an infrared detector in accordance with the invention, having a getter in a vacuum space of a dewar.

It should be noted that the FIGURE is diagrammatic and not drawn to scale. The relative dimensions and proportions of some parts of the drawing have been exaggerated or reduced in size for the sake of clarity and convenience in the drawing. The same reference signs as used in one embodiment are generally used when referring to corresponding or similar parts in another embodiment.

DETAILED DESCRIPTION OF THE PREFERRED EMBODIMENT

In the embodiment of FIG. 1. the invention is illustrated as a modification of an infrared detector dewar similar to that described in published European patent applications EP-A-0 006 277 and EP-A-0 087 827, which corresponds to U.S. Pat. No. 4,474,036, the whole contents of the disclosure of which are hereby incorporated herein as reference material. Similarly the whole contents of the disclosure of U.S. Pat. Nos. 3,851,173 and 4,206,354 are hereby incorporated herein as reference material.

Some parts of the infrared detector of FIG. 1 which it is not necessary to describe for an understanding of how to perform the present invention have not been shown in the drawings, but may be provided in known manner.

The infrared radiation detector of FIG. 1 comprises a dewar envelope 1,2, having an inner wall 1 and an outer wall 2. The inner wall 1 defines an inner chamber 11 of the dewar envelope and forms the cold finger of the detector. An outer chamber 12 holding a vacuum space is present between the inner and outer walls 1 and 2. At least one infrared radiation detector element 3 is mounted on the end face of the inner wall 1, in the vacuum space. The detector element or elements 3 may be of known type and may be secured in known manner to a substrate 5, for example of sapphire, on this end face.

The dewar envelope 1,2 may be of known type. The inner wall 1 may be of glass and the outer wall 2 may be of metal, for example a nickel-iron-cobalt alloy available under the Trade name Kovar. Although not shown in the drawing the inner glass wall 1 includes in known manner electrical conductors which are embedded therein. These conductors are electrically connected to electrodes of the detector element(s) 3 adjacent the end face of the inner wall 1, extend along the length of the inner wall 1 and pass outside the dewar envelope 1,2 where they are electrically connected in known manner to external connections for the detector. The outer wall 2 of the dewar comprises an end portion 6 which is not sealed to the remainder of the dewar envelope 1,2 until after mounting and connecting the detector element 3. The end portion 6 carries a window 7 transparent to the infrared radiation to be detected. An annular radiation shield 8 is also included around the detector element 3 in known manner.

In order to reduce outgassing of the component parts of the detector in the vacuum space during the service life of the detector, these component parts are prebaked in known manner in vacuo before assembly, and a general bakeout of the assembly is also carried out before mounting the detector element(s) 3. After sealing the dewar end assembly 6,7 to the remainder of the outer wall 2, the chamber 12 between the walls 1 and 2 is evacuated to produce a vacuum space in the detector of FIG. 1 and is then sealed off.

A major cause of infrared detector failure is the gradual degeneration of the vacuum in the space 12 between the inner and outer walls 1 and 2 due to internal outgassing of the various component parts of the detector exposed to the vacuum. The excessive outgassing which occurs in infrared detectors is associated with the fact that the gases cannot be driven out by baking the whole device during pumping (in the way which is usual for other vacuum devices) because infrared detector elements 3 are damaged at high temperatures. This degeneration in the vacuum eventually leads to the situation in which a cooling element 20 is no longer able (at least in an efficient manner or sufficiently fast) to cool the detector element 3 to the desired temperature for efficient detection of the infrared radiation. Thus, the detector lifetime is curtailed, especially as only limited cooling power is available in infrared detectors. Furthermore the outgassing into the vacuum space provides a thermal path between the cold finger 1 and the outside 2,6,7 of the detector so that, for example, dew will form on the infrared-transmissive window 7 of the detector in a normal atmosphere. In order to reduce these effects of internal out-gassing at least one getter 30 is provided in the vacuum space 12 for gettering gas molecules from this space 12.

In accordance with the present invention, the getter 30 comprises a porous layer of chemically-active getter material deposited on an inside surface area of the outer wall 2 at a location separated from both the cold finger 1 and the window 7. The getter layer 30 is deposited before sealing the metal outer wall 2 to the glass inner wall 1 of the dewar. An electrophoretic deposition process similar to that described in GB-A-2 179 785 may be used. In cases where the outer wall 2 is of metal, for example a glass or ceramic, the inside surface area where the layer 30 is required can be metallised to permit the electrophoretic deposition, or coating processes other than electrophoresis may be used for the deposition. By way of example, FIG. 1 illustrates the provision of the getter layer 1 as an annular band surrounding part of the cold finger 1 at a location spaced from the seals of the wall 2 to the inner wall 1 and to the end portion 6. This location is remote from the window 7 and the detector element(s) 3.

In one typical example for an infrared detector with a small dewar envelope, the volume of the space 12 may be in the range of 1 to 10 cm$^3$, the inside diameter of the outer wall 2 at the area of the getter 30 may be for example 10 mm to 20 mm; and the length of the porous getter layer 30 may be in the range of 4 to 10 mm, and its thickness may be several hundreds of microns (e.g. 300 to 400 $\mu$m). This arrangement in accordance with the invention provides a large area getter having a large gettering capacity for the space 12.

If so desired, additional (non-chemical) gettering action may also be used in the space 12 by including at least one shaped zeolite body 10 as a cooled molecular sieve on the cooled radiation shield 8 or elsewhere on the cold finger, in accordance with the teaching in EP-A-0 087 827. However, as described hereinafter, the outer surface of the shield 8 is preferably reflective. The cold finger 1 may house a known type of cryostat element 20 which is designed to utilize, for example, the refrigerating capability of the Joule-Thomson effect. This involves bleeding a fluid under pressure through a valve or other orifice into an area of lower pressure. When the fluid expands it absorbs heat in the low pressure area thus producing the cooling effect. The inner chamber 11 of the cold finger 1 adjacent the end face constitutes the low-pressure area. The cryogen fluid which may be for example dry air, nitrogen, or argon is supplied to the cooling element 20 via an inlet 22 of a mount 21. This mount 21 may be constructed with a resilient coupling in the manner disclosed in EP-A-0 006 297 so as to control movement of the cooling element 20 with respect to the inner wall 1 and detector element(s) 3. The envelope arrangement of FIG. 1 also comprises a dewar-mount 13 in which the dewar envelope 1,2 is partially accommodated. The mount 13 may be partially filled with, for example, silicone rubber 14 particularly around the connection 41 of the inner and outer walls 1 and 2 of the dewar envelope and the electrical connections to the electrical conductors for the detector element(s) 3. The dewar envelope 1,2 is secured in the mount 13, and the cooler-mount 21 is, for example, bolted to the dewar-mount 13 to hold the cooling element 20 in the dewar chamber 11.

Various known chemically-active getter materials may be used for the getter layer 30. An example of a suitable non-evaporable gettering material is for example the one commercially available from SAES Getters (G.B.) Limited of Croydon, England (SAES Getters-/USA Inc of Colorado Springs USA) under the SAES trade name St 122. It is a porous sintered structure based on a mixture of Ti and Zr-V-Fe alloy. The St 122 material can be deposited onto a wide variety of metallic surfaces with good adhesion, and conforms well to the shape of the inside surface area of the dewar wall 2. It has high porosity with good mechanical strength and coherence and a high diffusivity of the sorbed gas species. It has a good gettering efficiency even after a low temperature activation, for example at about 350° C. (degrees Celsius). In principle, the getter layer 30 can be partially activated during the bake out of the component 2 and kept under vacuum until the detector element 3 is mounted, although the benefit of this is largely lost unless the subsequent sealing steps in the assembly of the envelope are also performed under vacuum.

Either during or after evacuating and sealing the space 12, the activation of the getter can be performed (or at least completed) by heating the layer 30 through the portion of the outer wall 2 on which the getter material 30 is deposited. The use of HF induction heating (as in GB-A-2 179 785) is not recommended for this purpose because the fields can also induce heating in the detector element(s) 3 and radiation shield 8, and this may damage the infrared detector element. Therefore preferably the heating is localised or concentrated at the area of the layer 30 to be activated, and this is preferably below the level of the detector element(s) 3, e.g. as in FIG. 1.

The layer 30 may be heated by a heating coil around the portion of the outer wall 2 on the inside surface of which the getter material 30 is deposited, or for example by focussing radiant energy (e.g. from a high intensity lamp) on the portion of the outer wall 2 on the inside surface of which the getter material is deposited. This heating stage can be effected before mounting the dewar 1,2 in the dewar mount 13. In order to concentrate the heat onto the getter layer 30 in the location illustrated in FIG. 1, the outer surface of the cold finger is preferably silvered at least in the area facing the getter layer 30 so as to provide a heat reflector. The outer surface of the radiation shield 8 is also preferably reflective to protect the detector element(s) 3. In order to reduce heat conduction to the seal with the window 7, at least the end portion 6 of the outer wall is preferably of a thermally-insulating material such as a ceramic or glass. However by using metal for the portion 2 on which the layer 3 is provided an efficient electrophoretic deposition and uniform activation heating of the layer 3 can be obtained.

In order to maintain the window 7 cool during the activation heating of the getter 30, the end portion 6,7 may be mounted in a heat-sink during this heating stage. Furthermore, the cold finger may be operated to cool the detector elements while heating the layer 30 to activate the getter. The cold finger may be operated by simply circulating cold fluid, for example liquid nitrogen, through the inner chamber 11. Alternatively, the detector cooler 20 may be inserted at this stage and operated so as to cool the detector elements 3 during the getter activation.

Because the getter layer 30 is deposited on an inside surface area of an outer wall 2 of the detector envelope, it is also possible to reactivate the getter 30 by heating during the operational lifetime of the detector. This may be effected after removing the dewar 1,2 from the dewar mount 13. However, FIG. 1 illustrates a refinement in which a heating coil 50 is included in the dewar mount 13 around the wall area on which the getter 30 is deposited. This coil 50 may be used for the activation during detector manufacture and permits the getter 30 to be reactivated with the dewar 1,2 in situ in the mount 13, and also while operating the detector cooler 20 if so desired.

It will be evident that many modifications are possible within the scope of the present invention. The getter layer 30 may be deposited and activated at a higher level on the outer wall of a detector envelope, when the radiation shield 8 around the detector element(s) 3 has a reflective outer surface facing the getter layer 30 to reflect heat back to the layer 30 during activation heating. However, it is usually preferable to have the getter layer 30 at the lower level (not around the detector element(s) 3) so as to provide better protection for the detector element(s).

Although the illustrated specific embodiments relate to infrared detectors with double-walled vacuum dewars, the present invention may be used with advantage for other infrared detectors with different types of envelope, for example fast cool-down detectors. Its use also in this situation can reduce space or expense in the provision of a chemically-active getter 30 and avoid the inconvenience of using a getter unit with electrode connections requiring gas-tight seals in the outer wall 2 of the envelope. Thus, for example, some infrared detectors have a simple vacuum envelope or gas-filled envelope in which the detector elements are mounted on a cooler unit integrated in the envelope space 12. The cooler unit may be a Joule-Thomson or a Peltier (thermo-electric) cooler. A getter layer 30 can be provided and activated in accordance with the present invention on the outer wall 2 of this non-dewar infrared detector. When the envelope space 12 is filled with an inert thermally-insulating gas such as xenon (instead of having a vacuum), the getter layer 30 may be used to getter undesirable gases such as water vapour from the space 12.

From reading the present disclosure, other variations will be apparent to persons skilled in the art. Such variations may involve equivalents and other features which are already known in the design, manufacture and use of getters and of infrared detectors, the envelopes of infrared detectors and other vacuum and gas-filled devices, systems, and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicity or implicity or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. An infrared detector comprising an envelope, a cold finger in the envelope and at least one detector element mounted on an end of the cold finger so as to be cooled by the cold finger in operation of the detector, the envelope having an outer wall extending around the cold finger and an infrared-transmissive window facing the detector-element end of the cold finger, a space being present between the cold finger and the window and outer wall of the envelope, and a chemically-active getter present in said space to getter gases from the space, characterised in that the getter comprises a porous layer of chemically-active getter material deposited on an inside surface area of the outer wall at a location separated from both the cold finger and the window.

2. An infrared detector as claimed in claim 1, further characterised in that the chemically-active getter material on the outer wall extends around a heat reflector from which it is separated in the envelope by the space.

3. An infrared detector as claimed in claim 2, further characterised in that the heat reflector comprises a reflective surface area of the cold finger.

4. An infrared detector as claimed in claim 2, further characterised in that the heat reflector comprises a reflective surface of a radiation shield mounted on the cold finger around the detector element(s).

5. An infrared detector as claimed in claim 1, further characterised in that the getter can be activated (or re-activated) by heating through the portion of the outer wall on which the getter material is deposited.

6. An infrared detector as claimed in claim 1, further characterised in that the outer wall comprises a metal portion on which the getter material is deposited and a thermally-insulating portion which separates the metal portion from the window.

7. A method of manufacturing an infrared detector having an envelope with an outer wall and a cold finger disposed within the envelope characterised by the steps of:
    (a) depositing a porous layer of chemically-active getter material on the inside surface of the outer wall of the envelope,
    (b) mounting at least one detector element on the end of the cold finger,
    (c) mounting a window on the outer wall of the envelope to enclose the space within the envelope, and
    (d) activating the getter by heating the layer of getter material through the outer wall of the envelope.

8. A method as claimed in claim 7, further characterised in that the layer is heated by a heating coil around the portion of the outer wall on the inside surface of which the getter material is deposited.

9. A method as claimed in claim 7, further characterised in that the layer is heated by focussing radiant energy on the portion of the outer wall on the inside surface of which the getter material is deposited.

10. A method as claimed in claim 7, further characterised in that the cold finger is operated to cool the detector element(s) while heating the layer to activate the getter.

* * * * *